(12) United States Patent
Holahan et al.

(10) Patent No.: US 8,289,712 B2
(45) Date of Patent: Oct. 16, 2012

(54) FLUX-FREE DETACHABLE THERMAL INTERFACE BETWEEN AN INTEGRATED CIRCUIT DEVICE AND A HEAT SINK

(75) Inventors: Maurice F Holahan, Lake City, MN (US); Eric Vance Kline, Rochester, MN (US); Paul N Krystek, Highland, NY (US); Michael R Rasmussen, Mazeppa, MN (US); Arvind K Sinha, Rochester, MN (US); Stephen M Zins, Oronoco, MN (US)

(73) Assignee: International Business Machines Corporation, Armonk, NY (US)

( * ) Notice: Subject to any disclaimer, the term of this patent is extended or adjusted under 35 U.S.C. 154(b) by 149 days.

(21) Appl. No.: 12/819,753

(22) Filed: Jun. 21, 2010

(65) Prior Publication Data

US 2011/0310566 A1    Dec. 22, 2011

(51) Int. Cl.
H05K 7/20    (2006.01)
(52) U.S. Cl. ......... 361/710; 361/709; 361/715; 361/718
(58) Field of Classification Search ........... 361/700–722
See application file for complete search history.

(56) References Cited

U.S. PATENT DOCUMENTS

| | | | |
|---|---|---|---|
| 4,156,458 A | 5/1979 | Chu et al. | |
| 4,485,429 A | 11/1984 | Mittal | |
| 4,654,754 A | 3/1987 | Daszkowski | |
| 4,993,482 A | 2/1991 | Dolbear et al. | |
| 6,411,513 B1 * | 6/2002 | Bedard | 361/704 |
| 6,566,879 B1 | 5/2003 | Vanek et al. | |
| 7,042,729 B2 | 5/2006 | Dias et al. | |
| 7,147,041 B2 * | 12/2006 | Mitchell et al. | 165/80.3 |
| 7,200,006 B2 * | 4/2007 | Farrow et al. | 361/704 |
| 7,545,647 B2 | 6/2009 | Karidis et al. | |
| 7,916,485 B2 * | 3/2011 | Yu et al. | 361/710 |
| 7,983,042 B2 * | 7/2011 | Wilson | 361/700 |
| 7,990,717 B2 * | 8/2011 | Zhu et al. | 361/710 |
| 2004/0052052 A1 * | 3/2004 | Rivera | 361/700 |
| 2007/0115641 A1 | 5/2007 | Huang | |
| 2007/0133177 A1 * | 6/2007 | Loebach et al. | 361/704 |
| 2007/0201206 A1 * | 8/2007 | Farrow et al. | 361/700 |

OTHER PUBLICATIONS

J L. Horvath et al., "Spring Sheet Chip Cooling Device", IBM Technical Disclosure Bulletin. Sep. 1992, pp. 433-434.
J. P. Bansal, "Low Thermal Resistance Package Design for Semiconductor Devices", IBM Technical Disclosure Bulletin, Dec. 1987, pp. 49-50.

* cited by examiner

*Primary Examiner* — Courtney Smith
(74) *Attorney, Agent, or Firm* — J. B. Kraft; Steven L. Bennett

(57) ABSTRACT

A thermal flow material-free thermally conductive interface between a mounted integrated circuit device and a heat sink that comprises a mounted integrated circuit device, a heat sink vertically disposed over the device, a vertically compressible thermally conductive member unattachably disposed between the device and the heat sink, and an unattached frame member horizontally enclosing the compressible member.

6 Claims, 6 Drawing Sheets

FLUX-FREE DETACHABLE THERMAL INTERFACE BETWEEN AN INTEGRATED CIRCUIT DEVICE AND A HEAT SINK

TECHNICAL FIELD

The present invention relates to thermal interfaces between heat generating sources such as integrated circuit devices and their associated heat sinks.

BACKGROUND OF RELATED ART

Conventional high efficiency thermal interfaces have conventionally involved thermal flow materials including chemical materials such as thermally conductive greases, conductive epoxy compositions, conductive gels or molten material, such as solders or putties. In integrated circuit technology, such thermal interfaces are normally between a heat sink and the heat generating integrated circuit device in an IC stack or package mounted on a circuit board.

The integrated circuit art has progressed to the point that integrated circuit devices are very complex and expensive. Thus, there is a need for integrated circuit packages in which the integrated circuit device could be removed for rework or salvage without damage to the integrated circuit device, the interface or the heat sink.

SUMMARY OF THE PRESENT INVENTION

The present invention is directed to the problem of fully recoverable components and provides a thermal flow material-free thermally conductive interface between a mounted integrated circuit device and a heat sink that comprises a mounted integrated circuit device, a heat sink vertically disposed over the device, a vertically compressible thermally conductive member unattachably disposed between the device and the heat sink and a frame member horizontally enclosing the compressible member. As will be hereinafter described in greater detail, this frame member, that may be unattached, provides an elastomeric force that creates a bias angle between the vertically compressible thermally conductive member and the frame member, as well as a restoring force between these two members.

Preferably, the frame member has dimensions permitting horizontal expansion of the compressible member. Also, the compressible member preferably is a resilient member compressed within the elastic limit of the resilient member wherein the elasticity of the resilient member is fully recoverable. With such a structure, all members of the integrated circuit package would be recoverable intact. With the separable thermal interface of the present invention, there is no damage to the members in the structure due to assembly or disassembly.

BRIEF DESCRIPTION OF THE DRAWINGS

The present invention will be better understood and its numerous objects and advantages will become more apparent to those skilled in the art by reference to the following drawings, in conjunction with the accompanying specification, in which.

DETAILED DESCRIPTION OF THE PREFERRED EMBODIMENT

The thermal flow material-free thermally conductive interface of the present invention that is separable without any damage or destruction of the device, interface and heat sink will now be described with respect to several embodiments.

Figure 1:
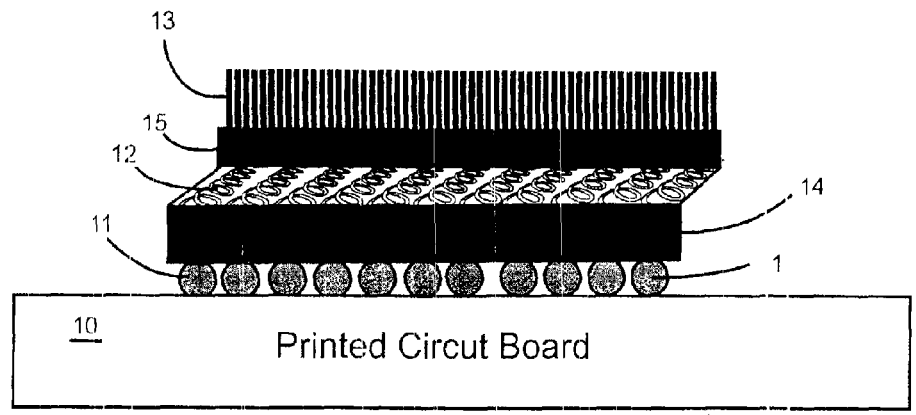
FIG. 1 is a diagrammatic view of an illustrative assembly showing an assembly stage when the heat sink is superimposed and compressed upon the compressible thermally conductive member.

With reference to FIG. 1, there is shown a diagrammatic view of an illustrative assembly showing an assembly stage when the heat sink is superimposed and compressed upon the compressible thermally conductive member. Integrated circuit device 14 is conventionally mounted on a substrate 10, a printed circuit board through solder joints 11. Resilient unattached thermally conductive interface 12 has been controllably collapsed, i.e. compressed, by heat sink 15 with fins 13 to form a detachable thermally conductive interface. As will be described hereinafter in greater detail, the compressed thermally conductive interface in this embodiment is a matrix of spring coils 12 coextensive with the upper surface of device 14 to provide the thermal path between heat sink 15 so that compressible coil matrix 12 remains in intimate thermal contact with the device, i.e. heat source 14 and heat sink 15, at all times due to the elastomeric biasing of compressible coil 12 against a retaining frame; which will be described further in FIG. 2 with respect to frame 16.

Figure 2:
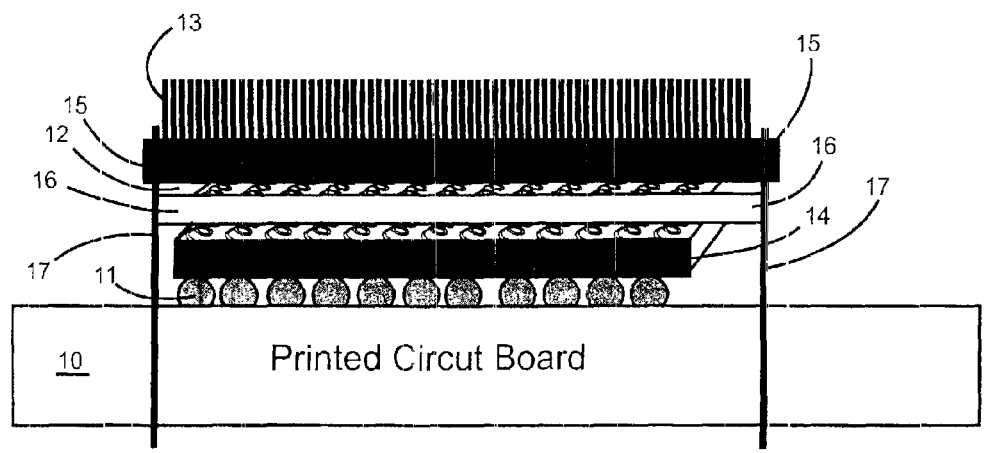
FIG. 2 illustrates the assembly of this invention mounted on a circuit board.

The metallic coil spring interface matrix must be unattached and remain unattached when the assembly is in the final package as shown in FIG. 2 wherein the assembly, including the compressed spring coils 12, is held in place by bolts or like connecting members 17. During assembly, the spring coil matrix is laterally retained by frame member 16. This structure may be readily assembled and disassembled without damage to any of the members forming the structure. There are no thermal greases, epoxy compounds, gels or metallurgical solders or putties in the structure. In subsequent rework or recovery, there is no need to clean out such materials. Also, the thermal cycle driven pumping effects associated with greases would be avoided.

Figure 3:
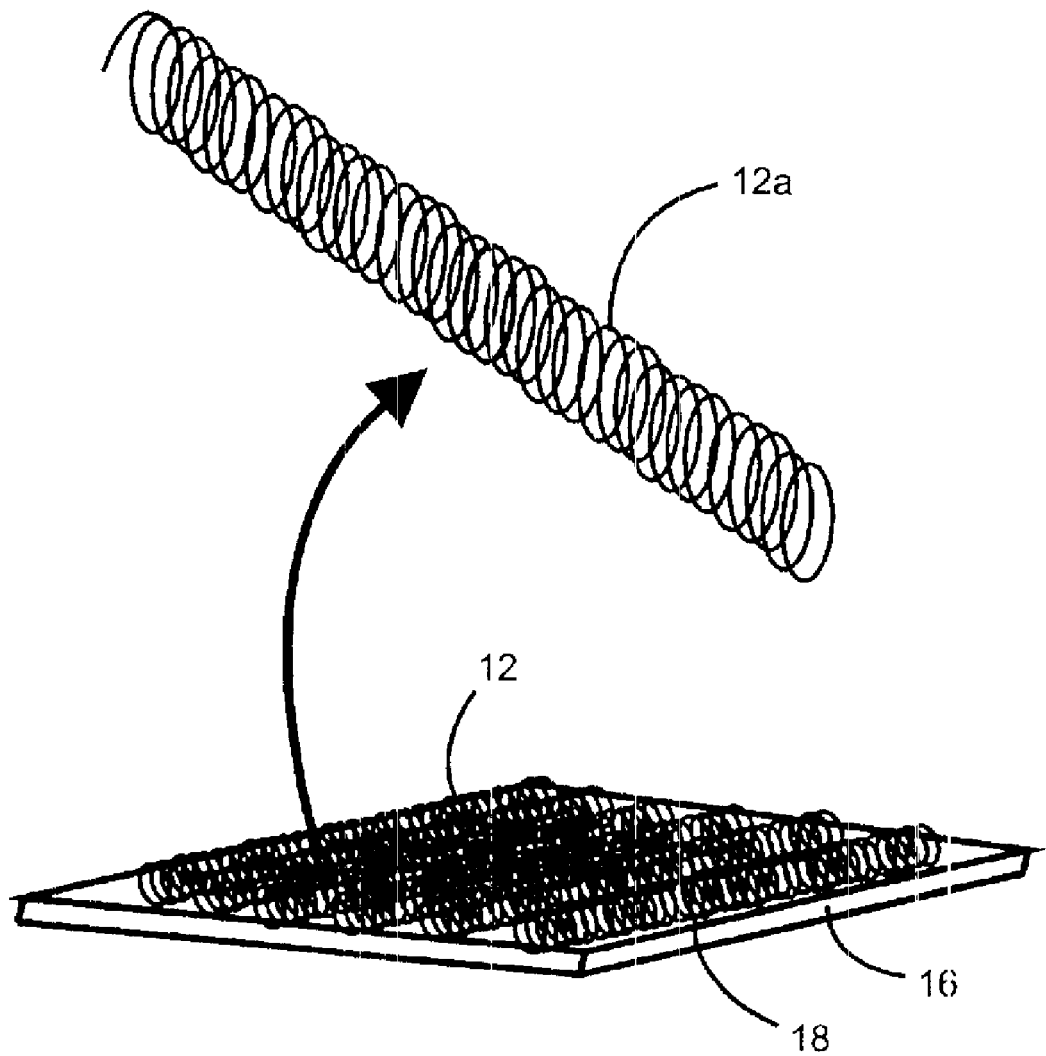
FIG. 3 is a diagrammatic view of an orthogonal matrix of coiled springs that provide the resilient compressible unattached thermally conductive interface between the heat generating integrated circuit device and the heat sink.

In the assembly, the unattached spring coil matrix 12 is horizontally retained by an enclosing frame 16. This spring matrix is shown in greater detail in FIG. 3 in which an individual spring coil 12a is broken out of the matrix and shown in greater detail. The frame 16 that encloses spring matrix 12 prevents significant horizontal movement of the spring matrix in assembly while providing the bias angle and restoring force to the compressible spring matrix 12 by virtue of the elastomeric force. However, there should be some room 18 (exaggerated for purpose of illustration) in the enclosure to permit some lateral expansion of the spring matrix during compression in assembly. As shown in FIGS. 1 through 3, the matrix is composed of wire-loop micro-springs 12a. In the operation of the package shown in FIG. 2, the thermal path between the heat source, device 14 and heat sink 15 is the 180 degree or half circle in each of matrix coils 12. It has been stressed that the spring matrix must be completely resilient so that the matrix may be recoverable intact. Thus, it is important that during assembly the spring matrix 12 is not compressed to the extent that it is permanently deformed. Accordingly, during assembly a small bias angle is introduced into the matrix so that the spring elastically collapses upon itself rather than deform and is fully recoverable and reworkable. Also, because of this angle, there is a constant contact force between the spring matrix and its mated device surface and heat sink surface without any contact force fatigue over time/thermal cycles. As an enhancement (not shown) to the structure, an elastomeric tube, preferably thermally conductive, may be inserted into each spring in the matrix.

In accordance with another aspect of the coiled spring matrix embodiment, the springs in the matrix are not biased to any angle and present a substantially flat surface at both the heat sink and device surfaces. The cross sections of the spring coils should be designed so that the collapse of the coils during assembly compression is within the coil's elasticity limits wherein the coil is fully resilient, i.e. has a 100% recovery without hyteresis.

Figure 4:
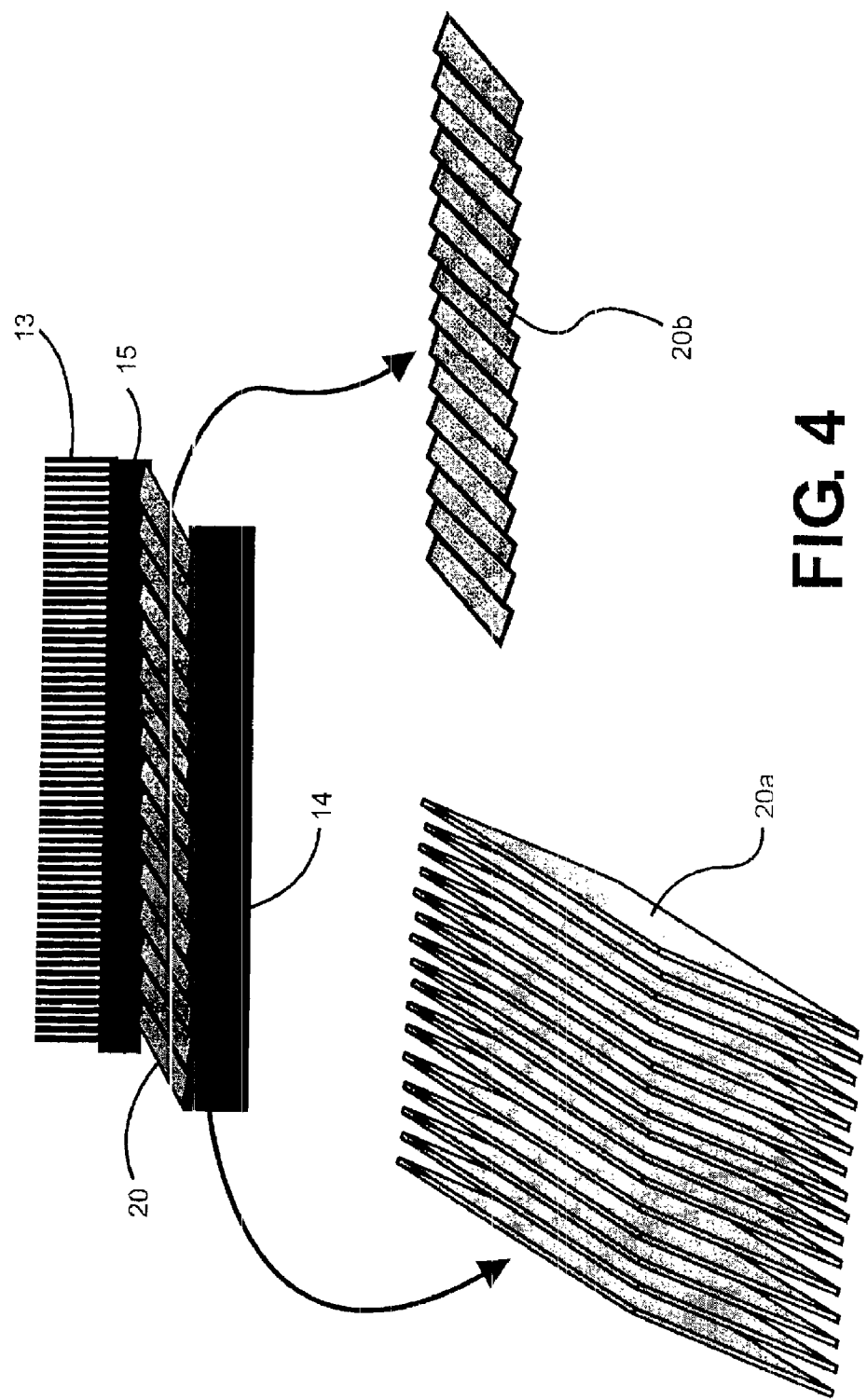
FIG. 4 is a diagrammatic view illustrating two types of shear plates that provide the resilient compressible unattached thermally conductive interface between the heat generating integrated circuit device and the heat sink.

With reference to FIG. 4, there is shown a diagrammatic view illustrating two types of shear plates that provide the resilient compressible unattached thermally conductive interface between the heat generating integrated circuit device and the heat sink. A matrix of parallel shearing plates 20 provide the thermally conductive interface between heat sink 15 and integrated circuit device 14. A detail of one type of plates is illustrated in 20b, while an alternative embodiment of such plates is shown in 20a. The thermal path between heat source device 14 and heat sink 15 is the short dimension of each of the plates 20 as shown in the view of FIG. 4. A small bias angle is introduced into the matrix of parallel plates 20 so that when the thermal stack is compressed during assembly, the parallel plates elastically collapse or shear on each other rather than deform beyond the point of full resiliency. Thus, the effect of the elastomeric force between the matrix of parallel plates 20 and an enclosing frame member (not shown) will be as described above with respect to other embodiments and will establish both the bias angle and the restoring force. The plate matrix is, thus, fully recoverable and reworkable. The plate matrix provides a constant and reliable contact force between the mated heat sink 15 and device 14 surfaces over time and thermal cycles without any contact force fatigue on the parallel plate matrix. The parallel plate embodiment of FIG. 4 has a capacity for very high metallic content in the thermal interface to thereby provide very high thermal conductivity.

In a variation of this embodiment (not shown), two or more matrices of shearing plates may be used wherein the biasing angle of each matrix would be oriented 180 degrees from its adjacent matrix. This would even further increase the metallic, i.e. thermally conductive, content of the interface.

Figure 5:
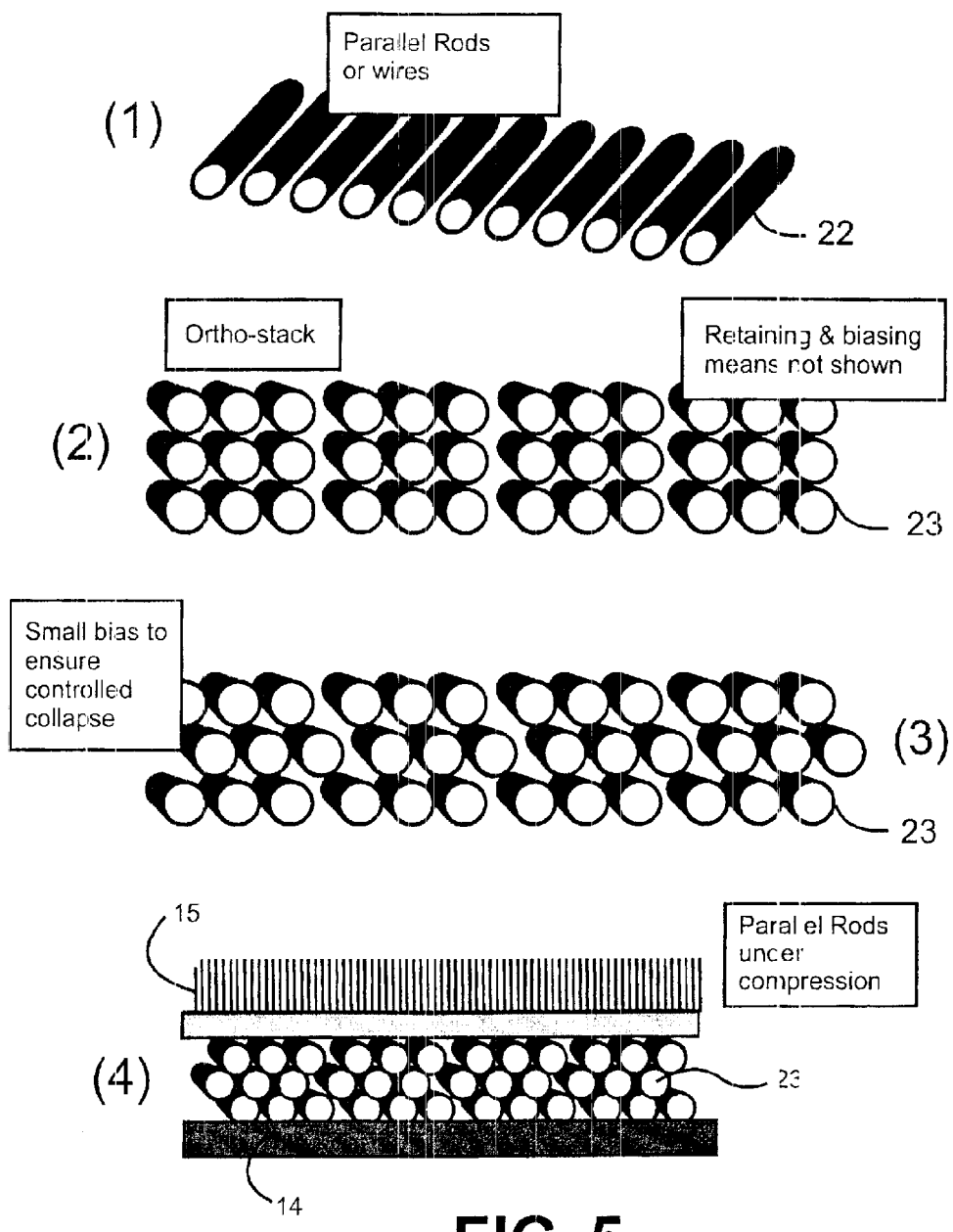
FIG. 5 shows some diagrammatic views of variety of parallel rod arrangements that provide the resilient compressible unattached thermally conductive interface between the heat generating integrated circuit device and the heat sink.

In FIG. 5, there are shown some embodiments of an assembly or matrix of parallel rods or wires 22 as illustrated in stage (1). The rods or wires are preferably stacked, stage (2), so that the thermal path between device 14 and heat sink 15 is wire-to-wire or rod-to-rod. In stage (3), a small bias angle is introduced between the stacked rods (here again utilizing an elastomeric effect between the stacked rods and a frame member (not shown) as described above). Thus, when assembled, the matrix 23 elastically collapses upon itself rather than deforming. This provides full recovery and reworkability for all members while maintaining a consistent contact force between the mated heat sink 15 and device 14 surfaces over time and thermal cycles without any contact force fatigue on the rod matrix.

Figure 6A:
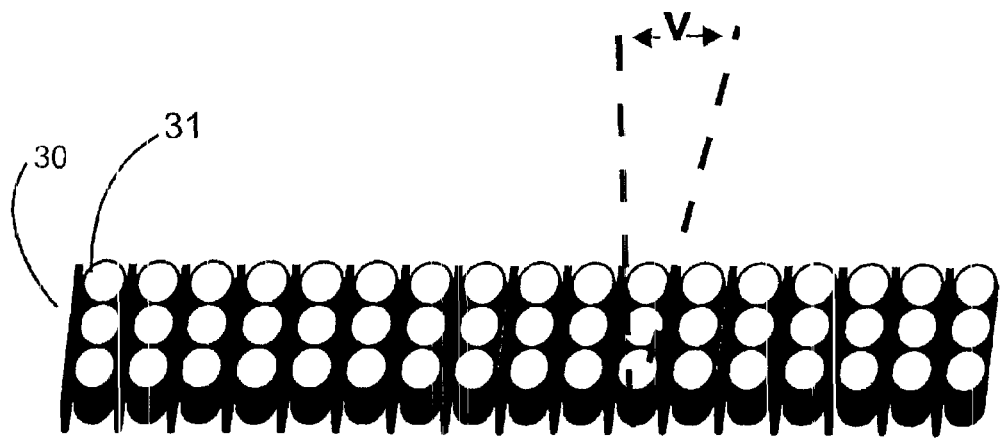
FIG. 6 shows some diagrammatic views of parallel plate and rod arrangements that provide the resilient compressible unattached thermally conductive interface between the heat generating integrated circuit device and the heat sink.
Figure 6B:
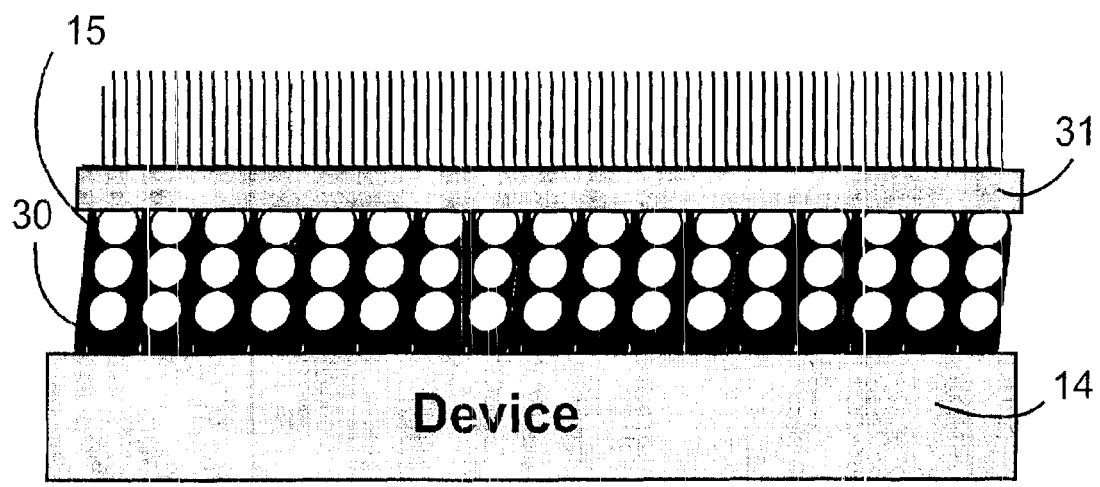

With reference now to FIGS. 6A and 6B, there is shown diagrammatic views of parallel plate and rod arrangements that provide the resilient compressible unattached thermally conductive interface between the heat generating integrated circuit device and the heat sink. The matrix is made up of alternating plates 30 and rods 31. The thermal path between the device heat source 14 and the heat sink 15 are the parallel plate 30 and rod 31 path, FIG. 6A. A small bias (angle v) is introduced into the combination matrix so that when the thermal stack is compressed during assembly, FIG. 6B, the parallel plates 30 and rods 31 elastically collapse or shear on each other rather than deform beyond the point of full resiliency. The plate/rod matrix is, thus, fully recoverable and reworkable. The plate/rod matrix provides a constant and reliable contact force between the mated heat sink 15 and device 14 surfaces over time and thermal cycles without any contact force fatigue on the parallel plate/rod matrix.

Figure 7:
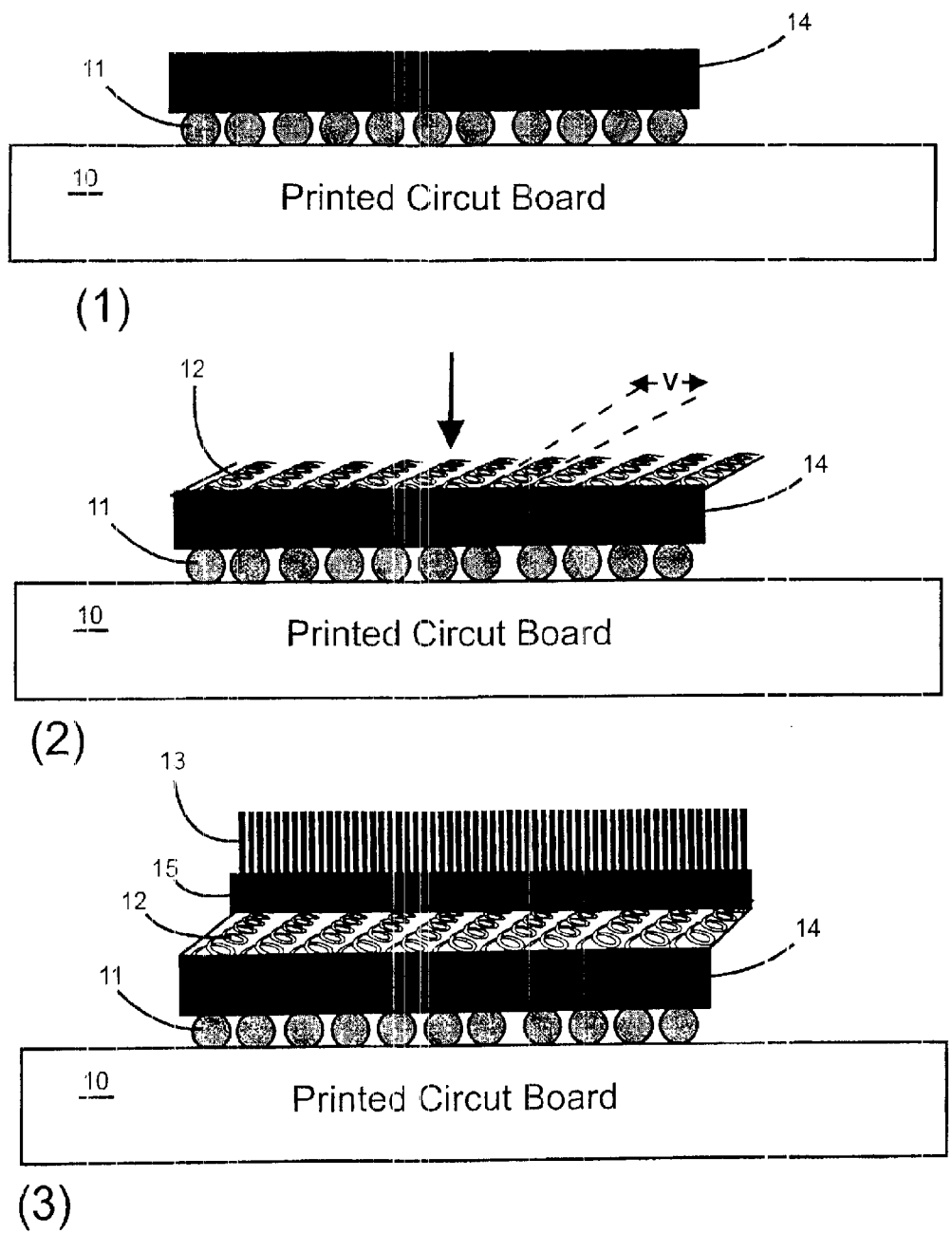
FIG. 7 is a diagrammatic view of steps in the method of assembling the structure of the present invention.

With respect to FIG. 7, the steps in the method of assembling the structure will now be described. Integrated circuit device 14 is conventionally mounted on a substrate 10, a printed circuit board through solder joints 11, step (1). Resilient unattached thermally conductive interface, e.g coiled spring matrix 12, is superimposed on the surface of device 14, step (2). A small bias (angle v) is introduced into the coiled spring matrix so that when the thermal stack is compressed during assembly, by compressing heat sink 15 upon coils 12, step (3), the parallel spring coils 12 elastically collapse or shear on each other rather than deform beyond the point of full resiliency. Since spring coils 12 have, thus, been controllably collapsed, there is formed a detachable thermally conductive interface. The resulting completed structure is shown in previously described FIG. 2, wherein the assembly is shown fully mounted on a printed circuit board 10. The heat sink 15, and device 14, and coil spring matrix that remain in intimate thermal contact, but without any permanent attachments are fully recoverable and reworkable.

As has been previously noted, during assembly, there is a frame 16 that encloses spring matrix 12 to prevent significant horizontal movement of the spring matrix in assembly and establishes the bias angle and restorative force between the compressible spring matrix 12 and frame 16.

Although certain preferred embodiments have been shown and described, it will be understood that many changes and modifications may be made therein without departing from the scope and intent of the appended claims.

What is claimed is:

1. A thermal flow material-free thermally conductive interface between a mounted integrated circuit device and a heat sink comprising:
   a mounted integrated circuit device;
   a heat sink vertically disposed over said device;
   a vertically compressible thermally conductive member comprising an array of parallel shearing plates stacked at small bias wherein said plates shear on themselves during compression unattachably disposed between said device and said heat sink; and
   a frame member, horizontally enclosing said compressible member, having dimensions permitting horizontal expansion of said unattached compressible member but maintaining said compressible member unattachably disposed between said device and heat sink by structural contact with said frame member.

2. An integrated circuit package assembly comprising:
a supporting substrate;
an integrated circuit device mounted on said substrate;
a heat sink superimposed on said device;
a vertically compressible thermally conductive member comprising an array of parallel shearing plates stacked at small bias wherein said plates shear on themselves during compression unattachably disposed between said device and said heat sink; and
a frame member horizontally enclosing said compressible member, having dimensions permitting horizontal expansion of said unattached compressible member but maintaining said compressible member unattachably disposed between said device and heat sink by structural contact with said frame member.

3. A thermal flow material-free thermally conductive interface between a mounted integrated circuit device and a heat sink comprising:
a mounted integrated circuit device;
a heat sink vertically disposed over said device;
a vertically compressible thermally conductive member comprising a planar orthogonal arrangement of rods stacked at small bias wherein said arrangement of rods collapses on itself during compression unattachably disposed between said device and said heat sink; and
a frame member, horizontally enclosing said compressible member, having dimensions permitting horizontal expansion of said unattached compressible member but maintaining said compressible member unattachably disposed between said device and heat sink by structural contact with said frame member.

4. An integrated circuit package assembly comprising:
a supporting substrate;
an integrated circuit device mounted on said substrate;
a heat sink superimposed on said device;
a vertically compressible thermally conductive member comprising a planar orthogonal arrangement of rods stacked at small bias wherein said arrangement of rods collapses on itself during compression unattachably disposed between said device and said heat sink; and
a frame member horizontally enclosing said compressible member, having dimensions permitting horizontal expansion of said unattached compressible member but maintaining said compressible member unattachably disposed between said device and heat sink by structural contact with said frame member.

5. The interface of claim 3, wherein said compressible member comprises a planar orthogonal arrangement of alternate rods and parallel shearing plates stacked at small bias wherein said arrangement of rods and plates collapses on itself during compression.

6. The integrated circuit package assembly of claim 4, wherein said compressible member comprises a planar orthogonal arrangement of alternate rods and parallel shearing plates stacked at small bias wherein said arrangement of rods and plates collapses on itself during compression.

* * * * *